(12) United States Patent
Yamashita et al.

(10) Patent No.: US 9,332,654 B2
(45) Date of Patent: May 3, 2016

(54) ELECTRONIC COMPONENT MOUNTING DEVICE AND ELECTRONIC COMPONENT MOUNTING METHOD

(75) Inventors: Shirou Yamashita, Yamanashi (JP); Tadashi Endo, Yamanashi (JP); Koji Kishita, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 223 days.

(21) Appl. No.: 13/980,149

(22) PCT Filed: Aug. 2, 2012

(86) PCT No.: PCT/JP2012/004931
§ 371 (c)(1),
(2), (4) Date: Jul. 17, 2013

(87) PCT Pub. No.: WO2013/021594
PCT Pub. Date: Feb. 14, 2013

(65) Prior Publication Data
US 2013/0291379 A1 Nov. 7, 2013

(30) Foreign Application Priority Data

Aug. 8, 2011 (JP) .................. 2011-172782

(51) Int. Cl.
*H05K 3/20* (2006.01)
*H05K 3/30* (2006.01)
*H05K 13/00* (2006.01)

(52) U.S. Cl.
CPC ............ *H05K 3/306* (2013.01); *H05K 13/0061* (2013.01); *Y10T 29/49139* (2015.01); *Y10T 29/53174* (2015.01)

(58) Field of Classification Search
CPC .......... H05K 13/0023; H05K 13/0061; H05K 13/04; H05K 13/048; H05K 3/306; Y10T 29/49128; Y10T 29/4913; Y10T 29/49149; Y10T 29/49144; Y10T 29/49155; Y10T 29/49163; Y10T 29/49169; Y10T 29/49213; Y10T 29/49224; Y10T 29/49904; Y10T 29/5196; Y10T 29/53048; Y10T 29/53091; Y10T 29/5313; Y10T 29/53187
USPC .......... 29/469, 33 P, 711, 721, 729, 740, 742, 29/822, 831, 832, 839, 843, 846, 850, 854, 29/879, 885; 438/107, 108, 109, 118, 119, 438/124–127
See application file for complete search history.

(56) References Cited

U.S. PATENT DOCUMENTS 5,588,195 A * 12/1996 Asai et al. .................... 29/33 M
6,789,720 B2 * 9/2004 Uchida et al. .................. 228/22
(Continued)

FOREIGN PATENT DOCUMENTS

CN 1533239 A 9/2004
JP 11-239927 A 9/1999
(Continued)

OTHER PUBLICATIONS

International Search Report for PCT/JP2012/004931 dated Sep. 11, 2012.
Office Action for Chinese Application No. 21280011152.0 dated Aug. 31, 2015.
(Continued)

*Primary Examiner* — Paul D Kim
(74) *Attorney, Agent, or Firm* — Pearne & Gordon LLP

(57) ABSTRACT

A bottom reception pin module 22 which is allowed to stand upright on a bottom reception base part 21 having a magnetic member 21a provided on an upper surface to support a board includes a base part 23 having a magnet member 26 built therein so as to be freely lifted and lowered and fixed to the bottom reception base part 21 by a magnetization force under a state that the magnet member 26 is lowered and a hollow shaft member 24 extended upward from the base part 23 and having an upper end of a top member 25 abutting on the lower surface of the board to support the board. By a vacuum suction from a suction hole 25c, the magnet member 26 is lowered and lifted to fix and unfix the base part 23 relative to the bottom reception base part 21.

2 Claims, 8 Drawing Sheets

(56) References Cited

U.S. PATENT DOCUMENTS

| | | | |
|---|---|---|---|
| 6,971,161 B1* | 12/2005 | Maenishi et al. | 29/832 |
| 7,047,632 B2* | 5/2006 | Arikado | 29/832 |
| 7,219,419 B2* | 5/2007 | Higashi et al. | 29/740 |
| 2003/0177633 A1* | 9/2003 | Haji et al. | 29/743 |
| 2009/0224026 A1* | 9/2009 | Yamamoto | 228/179.1 |

FOREIGN PATENT DOCUMENTS

| | | |
|---|---|---|
| JP | 2003-283197 A | 10/2003 |
| WO | 2005/081611 A1 | 9/2005 |

\* cited by examiner

ELECTRONIC COMPONENT MOUNTING DEVICE AND ELECTRONIC COMPONENT MOUNTING METHOD

TECHNICAL FIELD

The present invention relates to an electronic component mounting device, an electronic component mounting method and an arrangement changing method of bottom reception pin modules which changes the arrangement of the bottom reception pin modules in the electronic component mounting device.

BACKGROUND ART

In a component mounting process for mounting electronic component on a substrate, the substrate is positioned and held under a state that a lower surface side is supported by a bottom reception part. As a bottom reception system of the substrate, a bottom reception pin system is widely used that a plurality of bottom reception pins are allowed to abut on the lower surface of the substrate so that the substrate is supported. As an arrangement method of the pins in the bottom reception pin system, a method is used in which a plurality of self-supported type support pins (the bottom reception pins) are fixed to a support frame (a bottom reception base) by a magnetic force of a magnet in place of a usual method in which a bottom reception base is used that has a pin attaching holes formed in the shape of a grid (for instance, see patent literature 1). Thus, the support pins can be advantageously properly arranged so as to meet component which require bottom receptions in the substrate without a restriction of arranged positions of the pin attaching holes.

LITERATURE OF RELATED ART

Patent Literature

Patent Literature 1: JP-A-2003-283197

SUMMARY OF THE INVENTION

Problems that the Invention is to Solve

In recent years, in a manufacturing form of electronic devices, a small quantity of products having many kinds of forms is mainly manufactured. In the field of mounting component, a rearrangement operation is obliged to be frequently carried out in accordance with an exchange of kinds of substrates. Accordingly, an arrangement changing operation of the bottom reception pins due to the exchange of the kinds of the substrates, which is usually carried out by a manual operation of an operator, needs to be automated, a labor of the rearrangement operation needs to be saved and an efficiency needs to be improved.

However, in the substrate bottom reception method of the system that the bottom reception pins are fixed by the magnetic force including an example disclosed in the above-described patent literature, when the arrangement changing operation of the bottom reception pins is automated, below-described problems arise. Namely, in the arrangement changing operation of the pins, the bottom reception pins fixed to the bottom reception base by the magnetic force need to be separated from the bottom reception base against a fixing force by the magnetic force. At this time, the arrangement changing operation of the bottom reception pins is conveniently carried out by using a moving and mounting function of a mounting head provided in the electronic component mounting device. The bottom reception pins need to be attached to and detached from the bottom reception base by the sucking and holding force of a suction nozzle attached to the mounting head.

Ordinarily, the suction nozzle attached to the mounting head is exchangeable and held to the mounting head by a prescribed nozzle clamp force so that the suction nozzle may be automatically exchanged. In order to move the bottom reception pins by the mounting head having such a structure, the nozzle clamp force needs to be larger than the fixing force for fixing the bottom reception pins to the bottom reception base. However, since the bottom reception pins are required to stably hold positions even under a state that upper end component abut on the lower surface of the substrate, the above-described fixing force has a lower limit. The lower limit of the fixing force is larger than the nozzle clamp force of the suction nozzle. Accordingly, in the substrate bottom reception method of the system that the bottom reception pins are fixed by the magnetic force, an exclusively used nozzle is necessary which is provided with a mechanical chuck mechanism large in its holding force to automate the arrangement changing operation of the bottom reception pint. Thus, it is difficult to avoid the structure of the device from being complicated. As described above, in the bottom reception pins and the substrate bottom reception of the usual system which are fixed by the magnetic force, the arrangement changing operation of the pins due to the rearrangement operation is hardly efficiently automated by a simple structure.

Thus, it is an object of the present invention to provide an electronic component mounting device, an electronic component mounting method and an arrangement changing method of bottom reception pin modules which can efficiently automate a pin arrangement changing operation by a simple structure.

Means for Solving the Problems

An electronic component mounting device of the present invention holds and mounts an electronic component on a board by a adsorption nozzle attached to a mounting head. The electronic component mounting device includes a board bottom reception device having a bottom reception base part with a magnetic member provided on at least an upper surface and a plurality of bottom reception pin modules allowed to stand upright at arbitrary positions of the bottom reception base part to bear and support the board from a lower surface side. The bottom reception pin module includes a base part having a piston built therein which slides in a lift chamber provided therein to be lifted and lowered together with a magnet member with a permanent magnetism and fixed to the bottom reception base part by a magnetization force under a state that the magnet member is lowered and a shaft shaped part extended upward from the base part and having an upper end part abutting on the lower surface of the board to support the board. By a vacuum suction from a suction hole which is provided in the shaft shaped part and opened to the upper end part and communicates with the lift chamber by the adsorption nozzle, the magnet member is lifted together with the piston to separate the base part from the bottom reception base part so that the magnetization force is reduced to unfix the base part from the bottom reception base part.

In an electronic component mounting method of the present invention which holds and mounts an electronic component on a board by a adsorption nozzle attached to a mounting head, the electronic component mounting method includes a pin arrangement changing process which changes an arrangement of bottom reception pin modules in a board bottom reception device having a bottom reception base part with a magnetic member provided on at least an upper surface and a plurality of bottom reception pin modules allowed to stand upright at arbitrary positions of the bottom reception base part to bear and support the board from a lower surface side. The bottom reception pin module includes a base part having a piston built therein which slides in a lift chamber provided therein to be lifted and lowered together with a magnet member with a permanent magnetism and fixed to the bottom reception base part by a magnetization force under a state that the magnet member is lowered and a shaft shaped part extended upward from the base part and having an upper end part abutting on the lower surface of the board to support the board. In the pin arrangement changing process, by a vacuum suction from a suction hole which is provided in the shaft shaped part and opened to the upper end part and communicates with the lift chamber by the adsorption nozzle, the magnet member is lifted together with the piston to separate the base part from the bottom reception base part so that the magnetization force is reduced to unfix the base part from the bottom reception base part.

An arrangement changing method of bottom reception pin modules of the present invention changes an arrangement of bottom reception pin modules allowed to stand upright at arbitrary positions of a bottom reception base part having a magnetic member provided on at least an upper surface to bear and support a board from a lower surface side in an electronic component mounting device that holds and mounts an electronic component on the board by a adsorption nozzle attached to a mounting head. The bottom reception pin module includes a base part having a magnet member with a permanent magnetism built therein so as to be lifted and lowered and fixed to the bottom reception base part by a magnetization force under a state that the magnet member is lowered and a shaft shaped part extended upward from the base part and having an upper end part abutting on the lower surface of the board to support the board. In a pin arranging process that the bottom reception pin module is held by the adsorption nozzle and the mounting head is moved to arrange the bottom reception pin module on the bottom reception base part, the base part is allowed to abut on the bottom reception base part to lower the magnet member, so that the base part is fixed to the bottom reception base part by the magnetization force. In a pin detaching process that the bottom reception pin module is held by the adsorption nozzle and the mounting head is moved to detach the bottom reception pin module from the bottom reception base part, by a vacuum suction from a suction hole which is provided in the shaft shaped part and opened to the upper end part and communicates with the lift chamber by the adsorption nozzle, the magnet member is lifted together with the piston to separate the base part from the bottom reception base part so that the magnetization force is reduced to unfix the base part from the bottom reception base part.

Advantage of the Invention

According to the present invention, the bottom reception pin module for the electronic component mounting device is allowed to stand upright in the arbitrary position of the bottom reception base part having the magnetic member provided at least on the upper surface to bear and support the board from the lower surface side. The bottom reception pin module for the electronic component mounting device includes the base part having the magnet member with the permanent magnetism built therein so as to be freely lifted and lowered and fixed to the bottom reception base part by the magnetization force under a state that the magnet member is lowered and the shaft shaped part extended upward from the base part and having the upper end part abutting on the lower surface of the board to support the board. Thus, when the magnet member is lowered and lifted, the base part can be fixed to and unfixed from the bottom reception base part. Accordingly, a pin arrangement changing operation can be efficiently automated by a simple structure.

MODE FOR CARRYING OUT THE INVENTION

Figure 1:
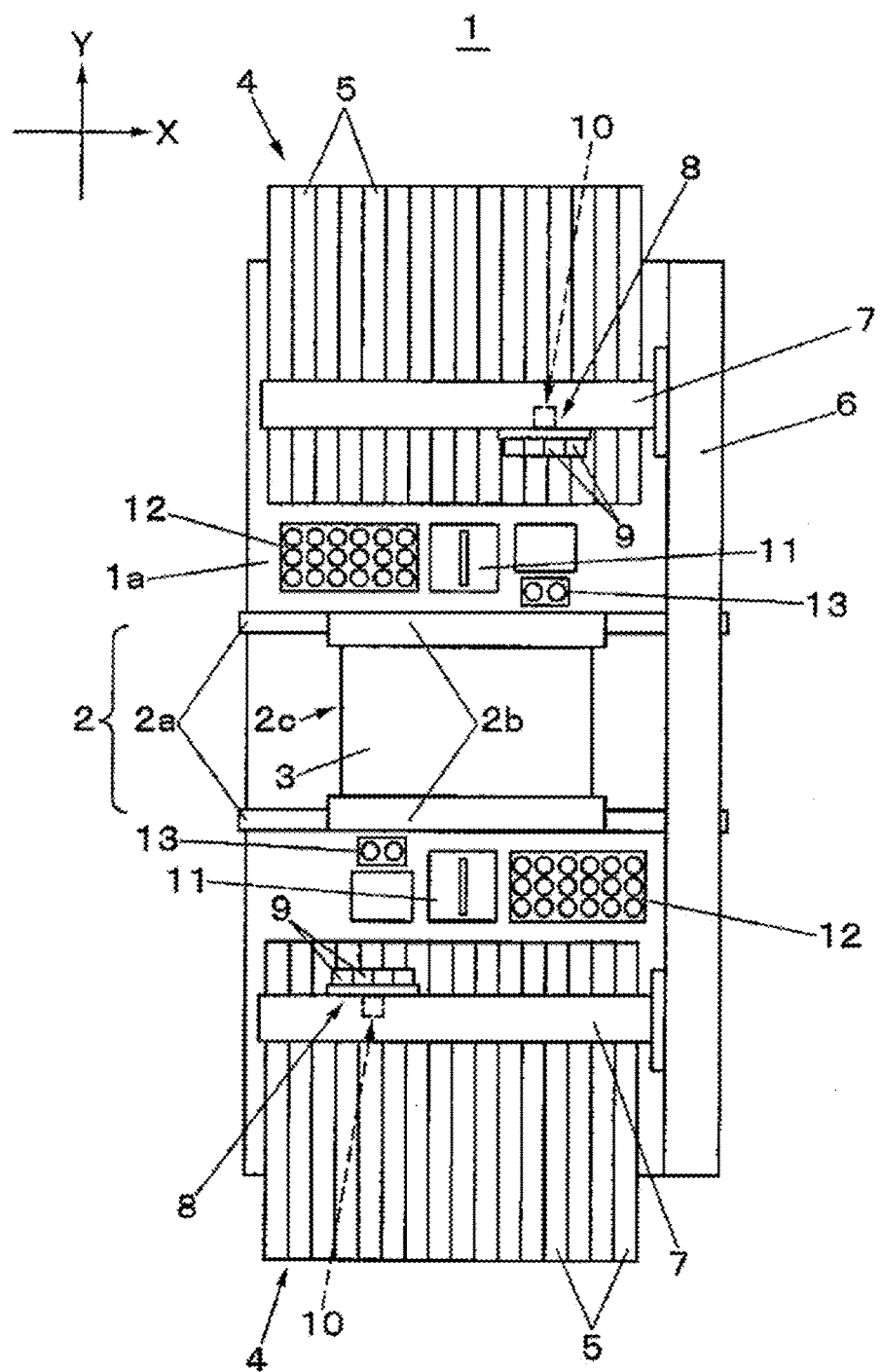
FIG. 1 is a plan view showing a structure of an electronic component mounting device of one exemplary embodiment of the present invention.

Now, an exemplary embodiment of the present invention will be described below by referring to the drawings. Initially, by referring to FIG. 1 and (a) and (b) in FIG. 2, an entire structure of an electronic component mounting device 1 will be described. The electronic component mounting device 1 has a function for holding an electronic component and mounting the electronic component on a substrate by a suction nozzle attached to a mounting head. In FIG. 1, in a central part of a base 1a, a substrate conveying mechanism 2 is arranged in a direction X (a substrate conveying direction). The substrate conveying mechanism 2 has a function for conveying a substrate 3 carried from an upstream side and positioning the substrate in a position of a mounting operation by a below-described component mounting mechanism, and includes two conveying rails 2a arranged in parallel. In a central part of the substrate conveying mechanism 2, are provided a substrate bottom reception mechanism 2c for supporting the carried substrate 3 from a lower side and pressing members 2b which press and clamp, from upper component, side end component of two opposed sides of the substrate 3 raised by the substrate bottom reception mechanism 2c.

At both sides of the substrate conveying mechanism 2, component feeding sections 4 are arranged which feed the electronic component as objects to be mounted. In the component feeding sections 4, a plurality of tape feeders 5 are arranged in parallel. The tape feeder 5 has a function for feeding pitch by pitch the component held by a carrier tape to a taking out position by the below-described component mounting mechanism. On one end part of an upper surface of the base 1a in the direction X, a Y-axis moving table 6 is arranged. To the Y-axis moving table 6, two X-axis moving tables 7 are connected so as to freely slide in a direction Y. To the X-axis moving tables 7, mounting heads 8 are respectively attached so as to freely slide.

The mounting head 8 is a multiple string head having a plurality of unit holding heads 9. The electronic component P as the object to be mounted is held under a vacuum suction from the tape feeder 5 by a adsorption nozzle 35A (see (a) in FIG. 7) for sucking the component which is attached to a nozzle holder 9a provided in a lower end part of the unit holding head 9. The Y-axis moving table 6 and the X-axis moving tables 7 form a head moving mechanism for moving the mounting heads 8. When the head moving mechanism is driven, the mounting heads 8 are moved between the component feeding sections 4 and the substrate 3 positioned in the substrate conveying mechanism 2. When the mounting heads 8 are lifted and lowered in the substrate 3, the held electronic component P (see (a) in FIG. 7) is mounted on the substrate 3. The mounting heads 8 and the head moving mechanism for moving the mounting heads 8 form the component mounting mechanism which takes out the component from the component feeding sections 4 to mount the component on the substrate 3.

On lower surfaces of the X-axis moving tables 7, substrate recognition cameras 10 are respectively attached which move integrally with the mounding heads 8. When the head moving mechanism is driven to move the substrate recognition camera 10 to an upper part of the substrate 3 held on the substrate conveying mechanism 2, the substrate recognition camera 10 picks up an image of a recognition mark formed on the substrate 3. In a moving path of the mounting head 8 between the component feeding section 4 and the substrate conveying mechanism 2, are arranged a component recognition camera 11, a first nozzle accommodating part 12 and a second nozzle accommodating part 13. When the mounting head 8 which takes out the component from the component feeding section 4 carries out a scanning operation that the mounting head passes above the component recognition camera 11 in a prescribed direction, the component recognition camera 11 picks up an image of the component held by the mounting head 8. In the first nozzle accommodating part 12, a plurality of adsorption nozzles 35A attached to the nozzle holders 9a of the unit holding heads 9 are accommodated and held correspondingly to kinds of the component. In the second nozzle accommodating part 13, adsorption nozzles 35B attached to the nozzle holders 9a of the unit holding heads 9 are accommodated and held. When the mounting head 8 makes an access to the first nozzle accommodating part 12 and the second nozzle accommodating part 13 to carry out a nozzle exchange operation, the suction nozzle attached to the unit holding head 9 can be exchanged in accordance with purposes and desired kinds of component.

Figure 2:
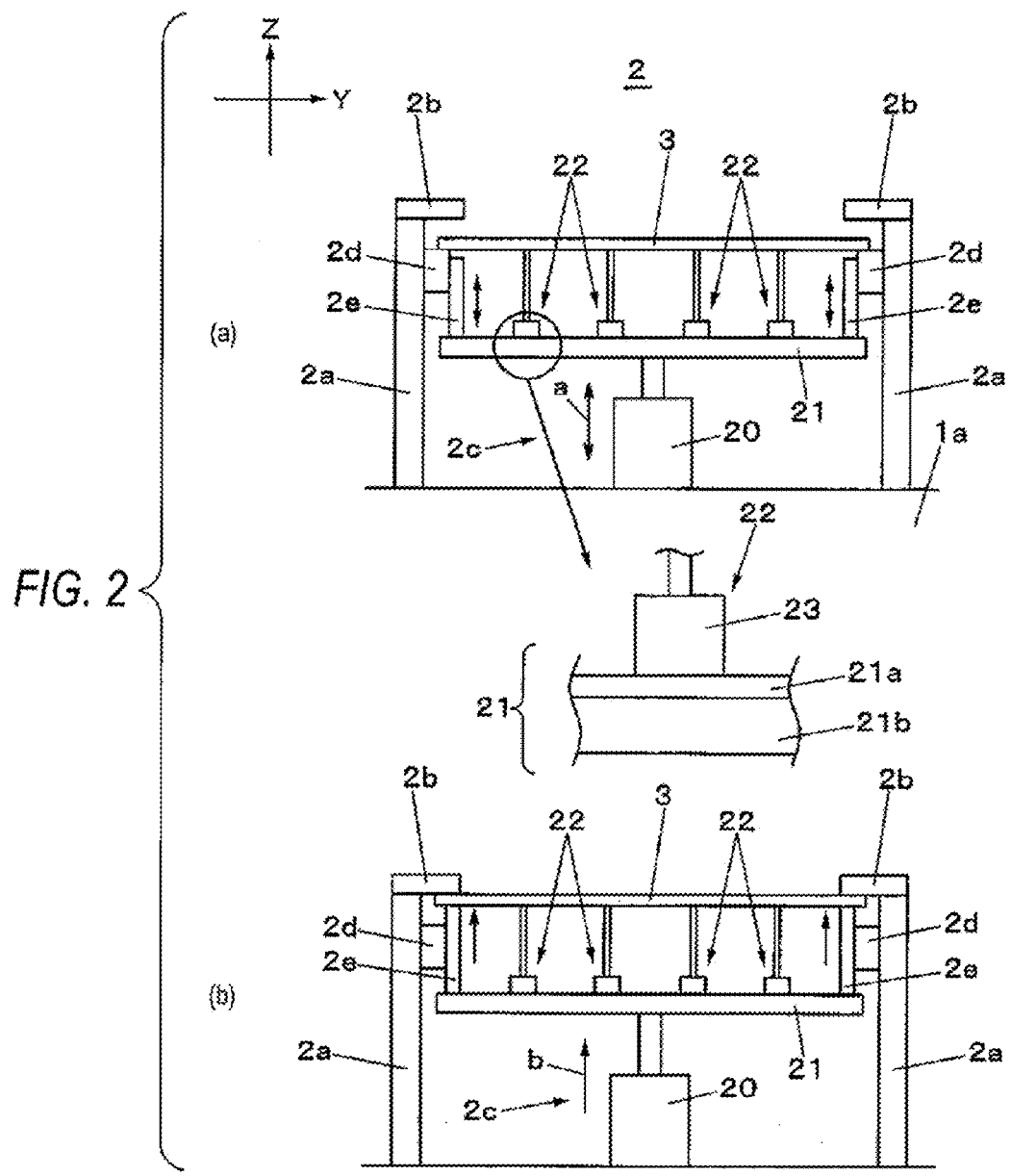
FIG. 2 is view in which (a) and (b) are structure explanatory views of a substrate conveying mechanism and a substrate bottom reception mechanism in the electronic component mounting device of the one exemplary embodiment of the present invention.

Now, by referring to (a) and (b) in FIG. 2, a structure and a function of the substrate conveying mechanism 2 will be described below. As shown in (a) in FIG. 2, the substrate conveying mechanism 2 includes the two conveying rails 2a arranged in parallel. Inside the conveying rails 2a, a conveyor mechanism 2d is provided along a conveying direction. When the conveyor mechanism 2d is driven under a state that both side end component of the substrate 3 are allowed to abut on an upper surface of the conveyor mechanism 2d, the substrate 3 is conveyed in a substrate conveying direction. Further, inside the conveyor mechanism 2d, clamp component 2e which support the side end component of the substrate from a lower side are arranged to abut on a bottom reception base part 21 so as to be freely lifted and lowered when the pressing members 2b press and clamp, from the upper component, the side end component of the substrate. In the central part of the substrate conveying mechanism 2, is arranged the substrate bottom reception mechanism 2c (a substrate bottom reception device) correspondingly to an operation position by the component mounting mechanism.

The substrate bottom reception mechanism 2c has a structure that the horizontal plate shaped bottom reception base part 21 is lifted or lowered (an arrow mark a) by a lift mechanism 20. On an upper surface of the bottom reception base part 21, bottom reception pin modules 22 stand upright which support the substrate 3 from a lower surface side. The bottom reception base part 21 has a structure that an upper surface of a plate member 21b made of a non-magnetic member such as aluminum is coated with a magnetic member 21a such as a steel plate. At arbitrary positions on the magnetic member 21a, the bottom reception pin modules 22 are arranged so as to meet bottom reception positions of the substrate 3 as an object to be supported from the lower surface side.

Figure 3:
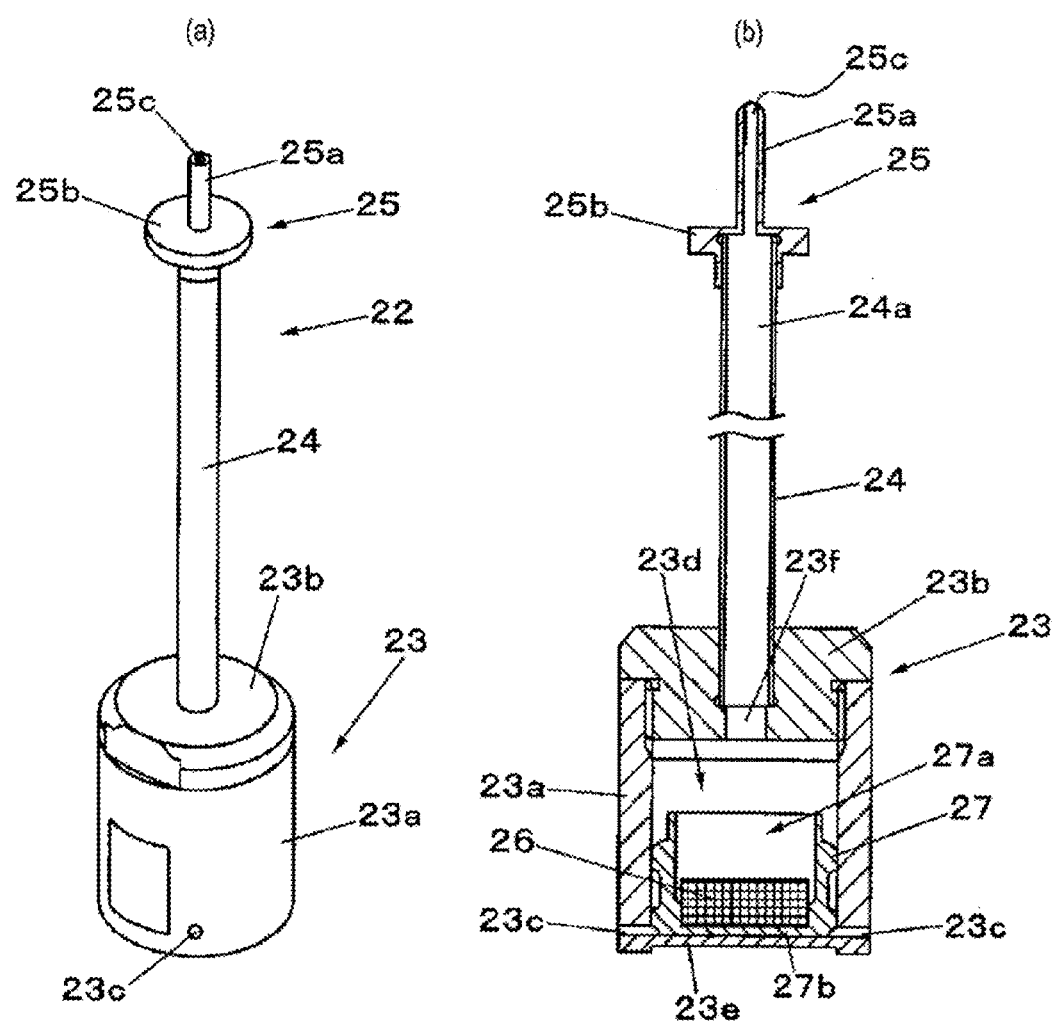
FIG. 3 is view in which (a) and (b) are structure explanatory views of a bottom reception pin module used in the substrate bottom reception mechanism of the electronic component mounting device of the one exemplary embodiment of the present invention.

In the bottom reception arrangement state, the bottom reception pin module 22 is fixed to the bottom reception base part 21 by a magnetization force applied between the bottom reception pin module 22 and the magnetic member 21a through a magnet member 26 (see (b) in FIG. 3) built in a base part 23 of the bottom reception pin module 22. An entire part of the bottom reception base part 21 may be formed with a magnetic material without difficulty. As the bottom reception base part 21 at least an upper surface may be provided with the magnetic member. Under this state, as shown in (b) in FIG. 2, the lift mechanism 20 is driven to lift the bottom reception base part 21 (an arrow mark b). Thus, upper end component of the bottom reception pin modules 22 and upper end component of the damp component 2e abut on the lower surface of the substrate 3. Thus, the substrate 3 is supported from the lower surface side by the substrate bottom reception mechanism 2c, and both the end component of the substrate 3 are pressed by lower surfaces of the pressing members 2b to fix a position.

Now, referring to (a) and (b) in FIG. 3 and (a) and (b) in FIG. 4, a structure and a function of the bottom reception pin module 22 used in the electronic component mounting device will be described below. As shown in (a) in FIG. 2, the bottom reception pin modules 22 are allowed to stand upright at the arbitrary positions of the bottom reception base part 21 having the magnetic member 21a provided at least on the upper surface and have functions for supporting the substrate 3 from the lower surface side. As shown in (a) in FIG. 3, the bottom reception pin module 22 has a structure that a hollow shaft member 24 having a top member 25 in an upper end part is extended upward from the base part 23 abutting on the bottom reception base part 21.

(b) in FIG. 3 showing a longitudinal section of the bottom reception pin module 22, the base part 23 includes a base part main body 23a provided with a cylindrical lift chamber 23d therein and a cover member 23b having an external thread part screwed and connected to an internal thread part worked on an upper part of an inner surface of the lift chamber 23d. To the lift chamber 23d, a piston 27 having a recessed part 27a an upper part of which is opened is fitted so as to freely slide upward and downward. To an upper surface side of a bottom part 27b provided in a lower part of the recessed part 27a, the magnet member 26 having a permanent magnetism is fixed.

The lift chamber 23d has a bottomed form having a bottom part 23e in a lower part. Under an ordinary state, the piston 27 abuts on the bottom part 23e in the lift chamber 23d. Here, the bottom part 27b and the bottom part 23e are set to be thin as much as possible. Thus, under a state that the base part 23 is mounted on the bottom reception base part 21, a space between the magnet member 26 and the magnetic member 21a is set to be small as much as possible so that the magnetization force by the magnet member 26 is sufficiently applied to the magnetic member 21a. In the base part main body 23a, a vent hole 23c is opened which allows a lower part of the lift chamber 23d to communicate with an external part so that a lifting and lowering operation of the piston 27 in the lift chamber 23d is not prevented by a pressure of air in the lift chamber 23d.

In the cover member 23b, the hollow shaft member 24 having a suction hole 24a is allowed to stand upright. The suction hole 24a communicates with the lift chamber 23d through an opening part 23f provided in the cover member 23b. To the upper end part of the hollow shaft member 24, the top member 25 is fixed that has a configuration including an abutting pin 25a with a small diameter which protrudes upward and a sucking or adsorbing collar part 25b which extends in a transverse direction. An upper end part of the abutting pin 25a abuts on the lower surface of the substrate 3 to support the substrate at the time of supporting the substrate from the lower surface side. In the abutting pin 25a, a suction hole 25c is provided to pass through in a vertical direction. Under a state that the top member 25 is attached, the suction hole 25c communicates with the suction hole 24a. Here, the top member 25 is provided as separate component from a main body of the hollow shaft member 24. However, the top member 25 and the hollow shaft member 24 may be formed as integral component. Namely, the hollow shaft member 24 and the top member 25 form a shaft shaped part which is extended upward from the base part 23 and has an upper end part abutting on the lower surface of the substrate 3 to support the substrate.

By referring to (a) and (b) in FIG. 4, the function of the bottom reception pin module 22 will be described. (a) in FIG. 4 shows a state that the bottom reception pin module 22 is merely mounted on the bottom reception base part 21. Under this state, the piston 27 is located on the bottom part 23e in the lift chamber 23d due to its tare weight. Since a distance D1 from a bottom surface of the magnet member 26 to an upper surface of the magnetic member 21a is set so that the magnetization force F1 of an adequate level may be applied to a part between the magnet member 26 and the magnetic member 21a, the base part 23 mounted on the bottom reception base part 21 is fixed to the bottom reception base part 21 by the magnetization force F1.

Figure 4:
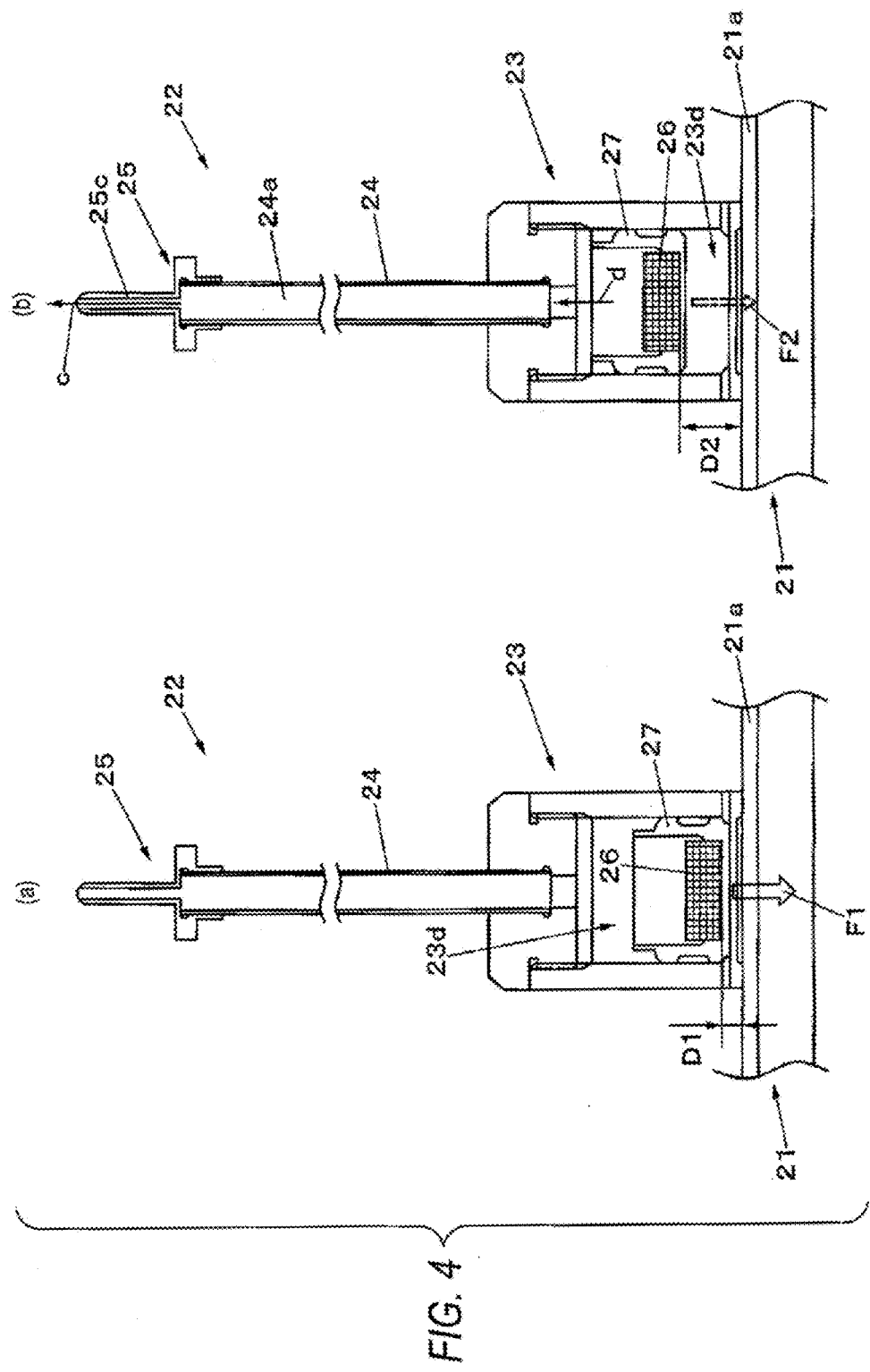
FIG. 4 is view in which (a) and (b) are function explanatory views of the bottom reception pin module used in the substrate bottom reception mechanism of the electronic component mounting device of the one exemplary embodiment of the present invention.

As compared therewith, (b) in FIG. 4 shows a state of a vacuum suction (an arrow mark e) from the suction hole 25c provided in the top member 25. Thus, an inner part of the lift chamber 23d which communicates therewith through the suction hole 24a is evacuated from an upper part so that the piston 27 slides upward in the lift, chamber 23d (an arrow mark d). As a result, a distance D2 between the lower surface of the magnet member 26 and the upper surface of the magnetic member 21a is greatly increased from D1 shown in (a) in FIG. 4. Thus, the magnetization force F2 applied to the part between the magnet member 26 and the magnetic member 21a is extremely reduced to release a fixed state of the base part 23 to the bottom reception base part 21.

Namely, the bottom reception pin module 22 having the above-described structure includes the base part 23 which has the magnet member 26 with the permanent magnetism built therein so as to be freely lifted and lowered and is fixed to the bottom reception base part 21 by the magnetization force under a state that the magnet member 26 is lowered and the shaft shaped part extended upward from the base part 23 and having the upper end part abutting on the lower surface of the substrate 3 to support the substrate. The base part 23 includes the piston 27 which slides together with the magnet member 26 to be lifted and lowered in the lift chamber 23d provided therein. When the magnet member 26 is lowered and lifted together with the piston 27, the base part 23 is fixed and unfixed relative to the bottom reception base part 21. In the present exemplary embodiment, the suction hole 25c is allowed to communicate with a suction or adsorption hole of the adsorption nozzle 35B attached to the mounting head 8 from the suction hole 24a which is provided in the shaft shaped part and opened to the suction hole 25c in the upper end part and communicates with the lift chamber 23d to carry out the vacuum suction, so that the magnet member 26 is lifted together with the piston 27.

Figure 5:
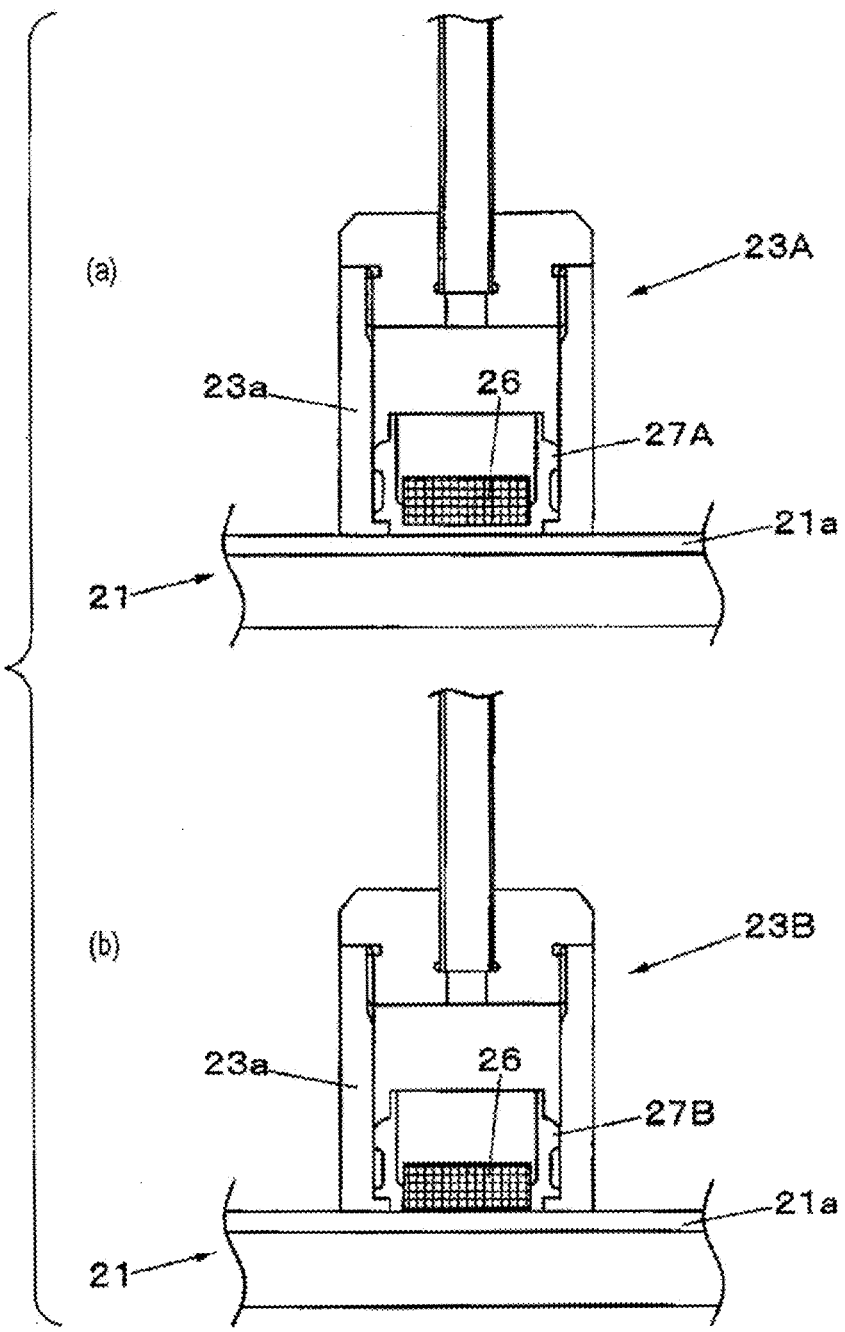
FIG. 5 is view in which (a) and (b) are structure explanatory views of the bottom reception pin module used in the substrate bottom reception mechanism of the electronic component mounting device of the one exemplary embodiment of the present invention.

In the structure of the base part 23, a base part 23A and a base part 23B shown in (a) and (b) in FIG. 5 may be used. In the base part 23A shown in (a) in FIG. 5, the bottom part 23e is removed from the bottomed base part 23 shown in (b) in FIG. 3 and a piston 27A is allowed to come into direct contact with the magnetic member 21a. Further, in the base part 23B shown in (b) in FIG. 5, a bottom part 27b is removed from the piston 27A in (a) in FIG. 5 and a magnet member 26 itself is allowed to come into direct contact with the magnetic member 21a. When such structures are used, the base part 23 can be fixed to the bottom reception base part 21 by a stronger fixing force.

Figure 6:
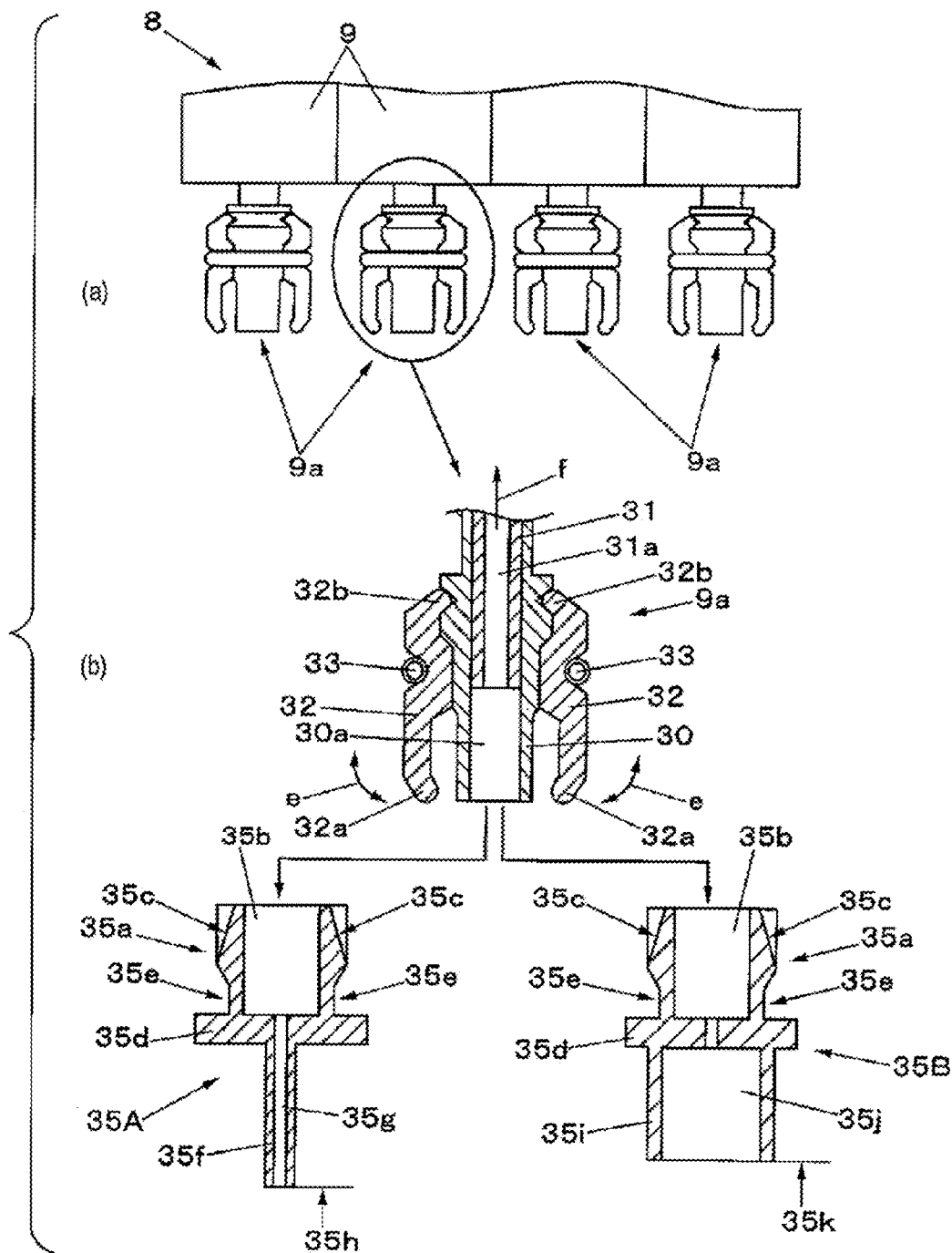
FIG. 6 is view in which (a) and (b) are structure explanatory views of a mounting head and a suction nozzle in the electronic component mounting device of the one exemplary embodiment of the present invention.

Now, by referring to (a) and (b) in FIG. 6, a structure of the mounting head 8 and the adsorption nozzle attached to the mounting head 8. As shown in (a) in FIG. 6, the mounting head 8 is the multiple string head having the plurality of unit holding heads 9 arranged in parallel. In the lower part of each of the unit holding heads 9, the nozzle holder 9a is provided which has a function for detachably holding the adsorption nozzle. As shown in (b) in FIG. 6, the nozzle holder 9a has a structure that a fitting hole 30a provided in a holder main body part 30 is fitted to a slide shaft 31 extended downward from a main body part of the unit holding head 9 and having a vacuum suction hole 31a so as to freely slide upward and downward and two clamp members 32 arranged in symmetrical positions on both side surfaces of the holder main body part 30 are urged inward by annular tension spring members 33.

In this structure, when an external force is applied to lower engaging pawl component 32a of the two clamp members 32 so as to open outward, the clamp members 32 rotate and move in an opening direction (arrow marks e) against an urging force of the tension spring members 33 on upper engaging pawl component 32b as supporting points. Thus, the adsorption nozzle can be attached. Under this state, the lower engaging pawl component 32a of the two clamp members 32 press inside the attached adsorption nozzle by the urging force of the tension spring members 33. Thus, the adsorption nozzle is clamped and fixed to the nozzle holder 9a.

In the present exemplary embodiment, two kinds of adsorption nozzles 35A and 35B are properly used in accordance with objects to be sucked or adsorbed or purposes. Namely, the adsorption nozzle 35A shown in (b) in FIG. 6 is a adsorption nozzle for sucking or adsorbing the component used in a component mounting operation for mounting the electronic component on the substrate 3. The adsorption nozzle 35B is a adsorption nozzle for moving a pin used to move the bottom reception pin module 22 when an arrangement of pins is changed in the substrate bottom reception mechanism 2c. Here, since the adsorption nozzles 35A and 35B are selectively attached and used to the common unit holding head 9, the adsorption nozzles 35A and 35B have an attachment interchangeability relative to the nozzle holder 9a, so that an upper attaching part 35a has the same structure in both the adsorption nozzles 35A and 35B.

In the attaching part 35a, a fitting hole 35b is provided to which the holder main body part 30 provided in the nozzle holder 9a is fitted. In a lower part of the attaching part 35a, a collar shaped part 35d is provided which is extended sideward. Further, in the attaching part 35a, tapered surfaces 35c are provided at opposed positions to each other. When the nozzle is attached and detached, the nozzle holder 9a is positioned to the adsorption nozzle to be lifted and lowered so that the clamp members 32 slide along the tapered surfaces 35c. Thus, the clamp members 32 are opened and closed on the upper engaging pawl component 32b on the supporting points.

In a lower part from the collar shaped part 35d, suction or adsorption component 35f and 35i of forms which meet the objects to be sucked or adsorbed are extended and provided. Namely, the suction or adsorption part 35f provided in the adsorption nozzle 35A has a nozzle shaft with the size of a diameter meeting the electronic component P as the object to be sucked or adsorbed. In the suction or adsorption part 35f, a suction or adsorption hole 35g passes through in a vertical direction which communicates with the fitting hole 35b and is opened to a suction or adsorption surface 35h in a lower end part. Further, the suction or adsorption part 35i provided in the adsorption nozzle 35B is provided with the size of a diameter meeting the sucking or adsorbing collar part 25b provided in the top member 25 of the bottom reception pin module 22 as the object to be sucked or adsorbed. A suction or adsorption surface 35k in a lower end part abuts on an upper surface of the sucking or adsorbing collar part 25b. In the suction or adsorption part 35i, a suction or adsorption hole 35j is provided which communicates with the fitting hole 35b.

Figure 7:
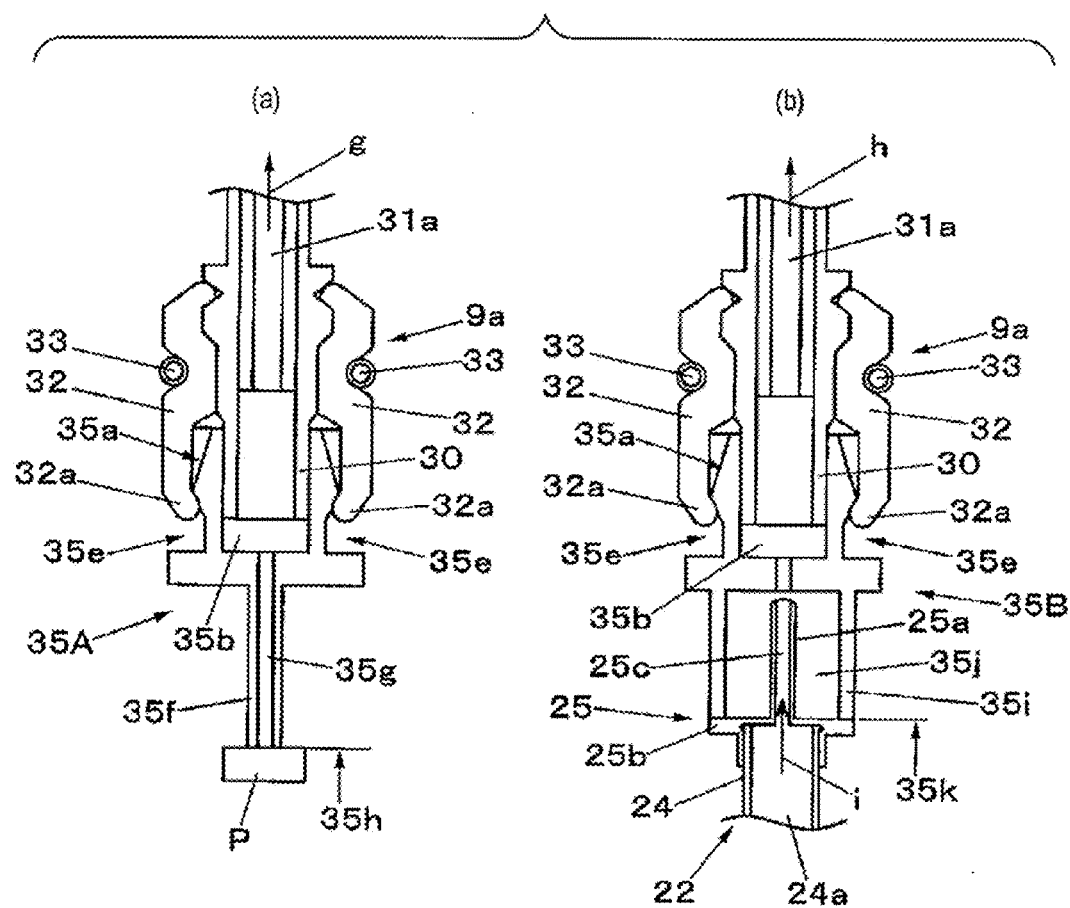
FIG. 7 is view in which (a) and (b) are function explanatory views of the suction nozzle attached to the mounting head of the electronic component mounting device of the one exemplary embodiment of the present invention.

(a) and (b) in FIG. 7 show states that the attaching component 35a of the adsorption nozzles 35A and 35B are respectively attached to the nozzle holders 9a to suck or adsorb and hold the electronic component P and the bottom reception pin module 22 respectively as the objects to be sucked or adsorbed thereby. Namely, as shown in (a) in FIG. 7, under a state that the attaching part 35a of the adsorption nozzle 35A is attached to the nozzle holder 9a, the holder main body part 30 is fitted to the fitting hole 35b. Further, the lower engaging pawl component 32a of the clamp members 32 hold engaging recessed component 35e from both sides and the adsorption nozzle 35A is clamped by the urging force of the tension spring members 33. Then, under this state, the suction or adsorption hole 35g communicates with the vacuum suction hole 31a through the fitting hole 35b to carry out a vacuum suction from the vacuum suction hole 31a (an arrow mark g). Thus, the electronic component P which abuts on the suction or adsorption surface 35h is sucked or adsorbed and held by a negative pressure in the suction or adsorption hole 35g.

Further, as shown in (b) in FIG. 7, under a state that the attaching part 35a of the adsorption nozzle 35B is attached to the nozzle holder 9a, the holder main body part 30 is similarly fitted to the fitting hole 35b. Further, the lower engaging pawl component 32a of the clamp members 32 hold the engaging recessed component 35e from both sides and the adsorption nozzle 35B is clamped by the urging force of the tension spring members 33. Then, under this state, the suction or adsorption hole 35j communicates with the vacuum suction hole 31a through the fitting hole 35b. Then, by the vacuum suction (an arrow mark h) from the vacuum suction hole 31a, the bottom reception pin module 22 is sucked or adsorbed and held by a negative pressure in the suction or adsorption hole 35j through the sucking or adsorbing collar part 25b abutting on the suction or adsorption surface 35h. Here, the diameter size of the suction or adsorption part 35i is set to such a size as to sufficiently ensure a suction or adsorption area which can suck or adsorb and hold a tare weight of the bottom reception pin module 22 by the vacuum suction.

Further, by the vacuum suction, the suction hole 24a of the hollow shaft member 24 undergoes a vacuum suction through the suction hole 25c provided in the abutting pin 25a. Thus, the vacuum suction of the lift chamber 23d in the base part 23 is also carried out through the suction hole 24a. Further, as described below, the magnet member 26 is lifted together with the piston 27 in the lift chamber 23d to reduce the magnetization force applied to the part between the magnet member 26 and the bottom reception base part 21.

As for the form and the structure of the adsorption nozzle 35B which sucks or adsorbs and holds the bottom reception module 22, various kinds of forms and structures may be used as well as the structures shown in (a) and (b) in FIG. 6 and (a) and (b) in FIG. 7 in the present exemplary embodiment. Namely, a form and a structure may be used which can carry out a vacuum suction of the suction hole 24a through the suction hole 25c provided in the abutting pin 25a and abut on the sucking or adsorbing collar part 25b so that the tare weight of the bottom reception pin module 22 may be sucked or adsorbed and held by the vacuum suction.

The electronic component mounting device 1 shown in the present exemplary embodiment is formed as described above. Now, in an electronic component mounting method by the electronic component mounting device 1, a pin arrangement changing method of the bottom reception pin module 22 will be described which is carried out in the substrate bottom reception mechanism 2c.

In an electronic component mounting operation by the electronic component mounting device 1, the substrate 3 carried from the upstream side is supported and held from the lower surface side by the plurality of bottom reception pin modules 22 arranged in the substrate bottom reception mechanism 2c of the substrate conveying mechanism 2. Then, in a machine type changing operation in which the kind of the substrate as an object to be operated is changed, a pin arrangement changing process is carried out that the number or the positions of the bottom reception pin modules 22 are changed in accordance with a kind of a new substrate in the substrate bottom reception mechanism 2c.

Figure 8:
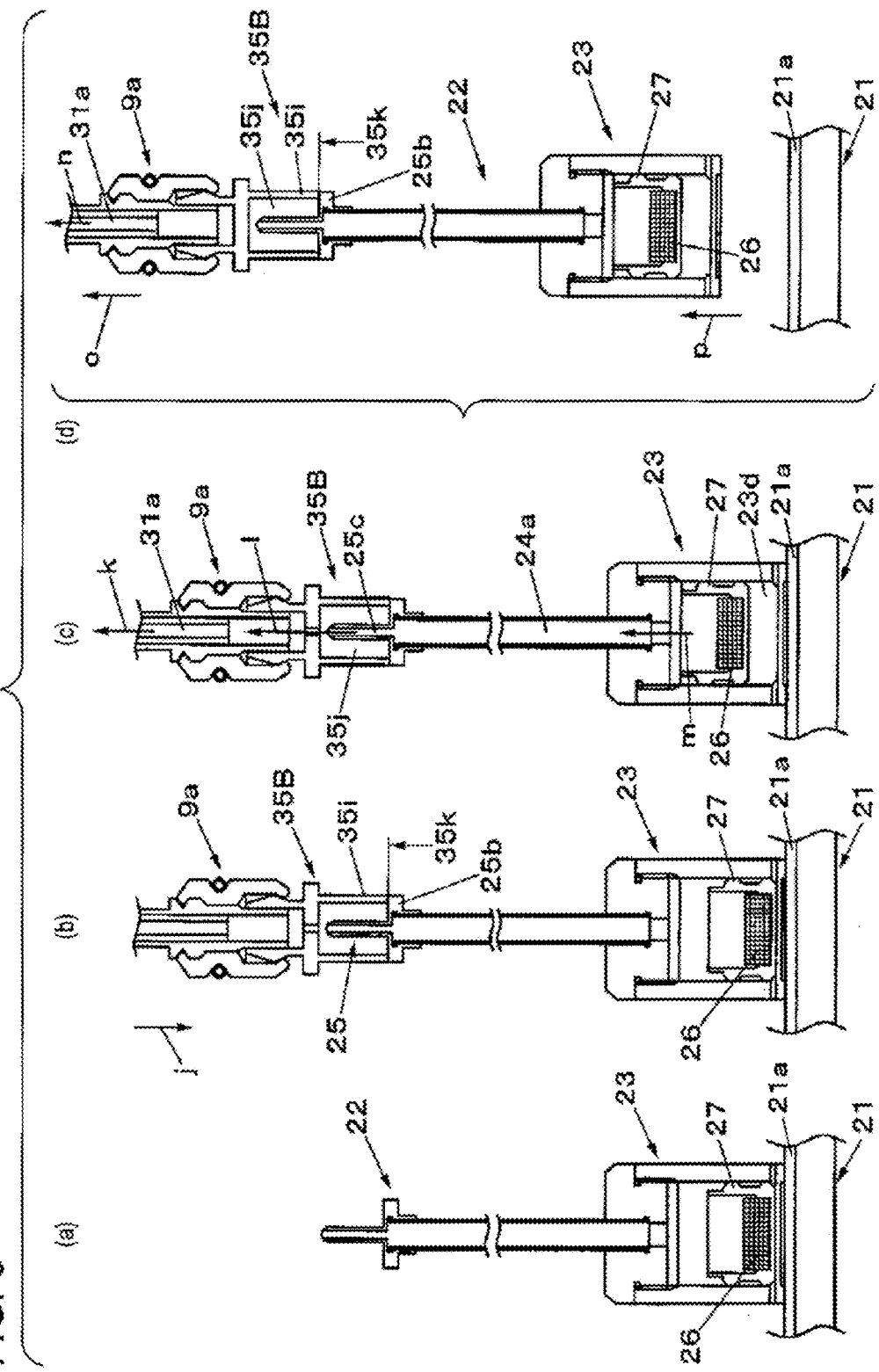
FIG. 8 is view in which (a) to (d) are operation explanatory views of a pin arrangement changing method in an electronic component mounting method of one exemplary embodiment of the present invention.

The pin arrangement changing method used in the pin arrangement changing process will be described by referring to (a) to (d) in FIG. 8. (a) in FIG. 8 shows a state that the bottom reception pin module 22 is arranged in a prescribed position of the bottom reception base part 21. Under this state, the magnet member 26 is lowered in the lift chamber 23d of the base part 23 and the base part 23 is fixed to the bottom reception base part 21 by the magnetization force applied to the part between the magnetic member 21a and the magnet member 26.

Then, (b), (c) and (d) in FIG. 8 show processes that the bottom reception pin module 22 arranged with its position fixed is moved by the mounting head 8. Initially, the mounting head 8 in which the adsorption nozzle 35A is attached to the nozzle holder 9a of the one unit holding head 9 is moved to an upper part of the bottom reception pin module 22 as an object a position of which is to be changed. Then, as shown in (b) in FIG. 8, the adsorption nozzle 35B attached to the nozzle holder 9a is lowered (an arrow mark j) to the top member 25 of the bottom reception pin module 22 to allow the suction or adsorption surface 35k in the lower end part of the suction or adsorption part 35i to abut on the upper surface of the sucking or adsorbing collar part 25b. Thus, the suction or adsorption surface 35k is sealed to seal the suction or adsorption hole 35j.

Under this state, as shown in (c) in FIG. 8, when the vacuum suction from the vacuum suction hole 31a is carried out (an arrow mark k), the suction hole 24a undergoes the vacuum suction (an arrow mark l) through the suction or adsorption hole 35j and the suction hole 25c. Thus, a pressure of the lift chamber is reduced through the suction hole 24a to lift the piston 27 together with the magnet member 26 in the lift chamber 23d (an arrow mark m). In accordance with the lifting operation, the magnet member 26 is separated from the magnetic member 21a of the bottom reception base part 21 to reduce the magnetization force applied to the part between the magnet member 26 and the magnetic member 21a. Thus, the fixed state of the base part 23 is released from the bottom reception base part 21.

In such a way, under a state that the base part 23 is unfixed to the bottom reception base part 21, the bottom reception pin module 22 is moved. Namely, as shown in (d) in FIG. 8, under a state that the vacuum suction from the vacuum suction hole 31a is continuously carried out (an arrow mark n) to reduce a pressure of the suction or adsorption hole 35j, the nozzle holder 9a of the unit holding head 9 is lifted (an arrow mark o) in the mounting head 8. At this time, since the fixed state of the base part 23 to the bottom reception base part 21 is released, only the tare weight of the bottom reception pin module 22 is applied to the adsorption nozzle 358 as a suction or adsorption load. In the adsorption nozzle 35B, since the diameter size of the suction or adsorption part 35i is set to such a size as to adequately suck or adsorb and hold the tare weight of the bottom reception pin module 22 by the vacuum suction, the bottom reception pin module 22 is lifted (an arrow mark p) and removed from the bottom reception base part 21.

Then, when the bottom reception pin module 22 detached as described above is arranged in a new position, the unit holding head 9 which sucks or adsorbs and holds the bottom reception pin module 22 by the adsorption nozzle 35B is moved to a desired position. Then, the adsorption nozzle 35B is lowered to allow the base part 23 of the sucked and held bottom reception pin module 22 to abut on the bottom reception base part 21. Then, the vacuum suction from the vacuum suction hole 31a is cancelled to lower the magnet member 26 together with the piston 27 in the lift chamber 23d of the base part 23. Thus, the magnetization force is applied to the part between the magnet member 26 and the magnetic member 21a to fix the base part 23 to the bottom reception base part 21.

Namely, in the above-described pin arrangement changing method, the bottom reception pin module 22 is held by the adsorption nozzle 35A and the mounting head 8 is moved. Thus, in a pin arranging process for arranging the bottom reception pin module in the bottom reception base part 21, the base part 23 is allowed to abut on the bottom reception base part 21 to lower the magnet member 26, so that the base part 23 is fixed to the bottom reception base part 21 by the magnetization force.

Then, the bottom reception pin module 22 is held by the adsorption nozzle 35B to move the mounting head 8. Thus, in a pin detaching process for detaching the base part 23 from the bottom reception base part 21, the vacuum suction from the suction holes 24a and 25c which are provided in the shaft shaped part including the hollow shaft member 24 and the top member 25 and opened to the upper end part and communicate with the lift chamber 23d is carried out by the adsorption nozzle 35B. Thus, the magnet member 26 is lifted together with the piston 27 to separate the base part 23 from the bottom reception base part 21. Accordingly, the magnetization force between the magnet member 26 and the magnetic member 21a is reduced to unfix the base part 23 from the bottom reception base part 21.

As described above, in the bottom reception pin module 22 and the substrate bottom reception mechanism 2c for the electronic component mounting device shown in the present exemplary embodiment, the bottom reception pin module 22 for the electronic component mounting device is included which is allowed to stand upright in an arbitrary position of the bottom reception base part 21 having the magnetic member 21a provided at least on the upper surface to support the substrate 3 from the lower surface side. The bottom reception pin module 22 includes the base part 23 having the magnet member 26, which has the permanent magnetism, built therein so as to be freely lifted and lowered and fixed to the bottom reception base part 21 by the magnetization force under a state that the magnet member 26 is lowered and the hollow shaft member 24 which is extended upward from the base part 23 and has the upper end part abutting on the lower surface of the substrate 3 to support the substrate. Thus, when the magnet member 26 is lowered and lifted, the base part 23 can be fixed and unfixed relative to the bottom reception base part 21. Accordingly, a pin arrangement changing operation can be efficiently automated by a simple structure.

It is to be understood that various changes and applications made by a person with ordinary skill in the art in accordance with the description of the specification and a well-known technique without departing from the gist and scope of the present invention are anticipated by the present invention and included within a range to be protected. Further, the component elements in the above-described exemplary embodiment may be arbitrarily combined together within a range which does not deviate from the gist of the present invention.

This application is based on Japanese Patent Application (JPA. No. 2011-172782) filed on Aug. 8, 2011 and contents thereof are incorporated herein as a reference.

INDUSTRIAL APPLICABILITY

The electronic part mounting device, the electronic component mounting method and the arrangement changing method of the bottom reception pin modules of the present invention can effectively efficiently automate the position changing operation of the bottom reception pins by a simple structure and are available in the field of mounting the electronic component where an operating head is lifted or lowered on the board to carry out an operation.

DESCRIPTION OF REFERENCE NUMERALS AND SIGNS

1 electronic component mounting device
2 substrate conveying mechanism
2c substrate bottom reception mechanism
3 substrate
8 mounting head 9 unit holding head
9a nozzle holder
21 bottom reception base part
21a magnetic member
22 bottom reception pin module
23 base part
23d lift chamber
24 hollow shaft member
24a suction hole
25 top member
25a abutting pin
25c suction hole
26 magnet member
27 piston
35A, 35B adsorption nozzle

The invention claimed is:

1. An electronic component mounting device which holds and mounts an electronic component on a board by an adsorption nozzle attached to a mounting head, the electronic component mounting device comprising:
   a board bottom reception device having a bottom reception base part with a magnetic member provided on at least an upper surface and a plurality of bottom reception pin modules allowed to stand upright at arbitrary positions of the bottom reception base part to bear and support the board from a lower surface side;
   wherein each of the plurality of bottom reception pin modules includes a base part having a piston built therein which slides in a lift chamber provided therein to be lifted and lowered together with a magnet member with a permanent magnetism and fixed to the bottom reception base part by a magnetization force under a state that the magnet member is lowered, and a shaft shaped part extended upward from the base part and having an upper end part abutting on the lower surface of the board to support the board;
   wherein the magnet member is lifted together with the piston to separate the base part from the bottom reception base part, by vacuum suction from a suction hole which is provided in the shaft shaped part and opened to the upper end part and communicates with the lift chamber by the adsorption nozzle, so that the magnetization force is reduced to unfix the base part from the bottom reception base part.

2. An electronic component mounting method which holds and mounts an electronic component on a board by an adsorption nozzle attached to a mounting head, the electronic component mounting method comprising:
   a pin arrangement changing process which changes an arrangement of a plurality of bottom reception pin modules in a board bottom reception device having a bottom reception base part with a magnetic member provided on at least an upper surface and the plurality of bottom reception pin modules allowed to stand upright at arbitrary positions of the bottom reception base part to bear and support the board from a lower surface side, and
   wherein each of the plurality of bottom reception pin modules includes a base part having a piston built therein which slides in a lift chamber provided therein to be lifted and lowered together with a magnet member with a permanent magnetism and fixed to the bottom reception base part by a magnetization force under a state that the magnet member is lowered and a shaft shaped part extended upward from the base part and having an upper end part abutting on the lower surface of the board to support the board,
   wherein in the pin arrangement changing process, by a vacuum suction from a suction hole which is provided in the shaft shaped part and opened to the upper end part and communicates with the lift chamber by the adsorption nozzle, the magnet member is lifted together with the piston to separate the base part from the bottom reception base part so that the magnetization force is reduced to unfix the base part from the bottom reception base part.

\* \* \* \* \*